(12) United States Patent
Hartwell et al.

(10) Patent No.: US 6,930,368 B2
(45) Date of Patent: Aug. 16, 2005

(54) MEMS HAVING A THREE-WAFER STRUCTURE

(75) Inventors: Peter G. Hartwell, Sunnyvale, CA (US); Storrs T. Hoen, Brisbane, CA (US); David Horsley, Berkeley, CA (US); Chung Ching Yang, Saratoga, CA (US); Paul P. Merchant, Belmont, CA (US); Carl P. Taussig, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/630,769

(22) Filed: Jul. 31, 2003

(65) Prior Publication Data

US 2005/0023547 A1 Feb. 3, 2005

(51) Int. Cl.[7] .............................................. H01L 29/82
(52) U.S. Cl. ...................................... 257/418; 257/417
(58) Field of Search ................................. 257/415, 416, 257/417, 418

(56) References Cited

U.S. PATENT DOCUMENTS

| | | | |
|---|---|---|---|
| 5,006,487 A | * | 4/1991 | Stokes .......................... 438/52 |
| 5,352,918 A | * | 10/1994 | Thomas et al. .............. 257/417 |
| 5,557,596 A | | 9/1996 | Gibson et al. |
| 5,844,286 A | * | 12/1998 | Hase ........................... 257/417 |
| 5,986,381 A | | 11/1999 | Hoen et al. |
| 6,105,427 A | | 8/2000 | Stewart et al. |
| 6,436,794 B1 | | 8/2002 | Lee et al. |
| 6,440,820 B1 | | 8/2002 | Lee et al. |
| 6,465,355 B1 | | 10/2002 | Horsley |
| 6,465,854 B1 | * | 10/2002 | Muenzel et al. ............. 257/417 |
| 6,504,385 B2 | | 1/2003 | Hartwell et al. |
| 6,590,850 B2 | | 7/2003 | Eldredge et al. |
| 6,776,042 B2 | | 8/2004 | Pike et al. |
| 6,784,592 B2 | | 8/2004 | Hartwell |
| 6,784,593 B2 | | 8/2004 | Hartwell |
| 6,784,630 B2 | | 8/2004 | Hartwell |
| 2003/0032215 A1 | * | 2/2003 | Ives ............................. 438/52 |
| 2003/0049878 A1 | * | 3/2003 | Offenberg et al. ............ 438/50 |
| 2003/0067047 A1 | * | 4/2003 | Sandoe et al. .............. 257/415 |
| 2003/0166310 A1 | * | 9/2003 | Caplet ......................... 438/50 |

OTHER PUBLICATIONS

Krause, Carolyn, "Microcantilevers: ORNL's Sensors With Sensitivity", Oct. 7, 1996, http://www.eurekalert.org/pub_releases/1996-10/ORNL-MOSW-071096.php.

* cited by examiner

Primary Examiner—Ngân V. Ngô

(57) ABSTRACT

A microelectromechanical system includes a first wafer, a second wafer including a moveable portion, and a third wafer. The movable portion is movable between the first wafer and the third wafer. The first wafer, the second wafer, and the third wafer are bonded together.

53 Claims, 6 Drawing Sheets

MEMS HAVING A THREE-WAFER STRUCTURE

FIELD OF THE INVENTION

This invention relates generally to a microelectromechanical system (MEMS). More particularly, the invention relates to microelectromechanical system having a three-wafer structure.

BACKGROUND OF THE INVENTION

MEMS devices are a combination of micro mechanical and micro electronic systems that are revolutionizing nearly every product category by bringing together these systems. A MEMS device typically comprises a movable micro mechanical structure and silicon based microelectronics. One type of known MEMS device is a MEMS transducer. Analog Devices™ manufactures a capacitive MEMS transducer used in an air-bag system for crash detection. For example, a crash is detected by monitoring the movement of the mechanical structure in the MEMS transducer using associated microelectronics in the MEMS transducer. The mechanical structure in the transducer comprises a capacitive plate which is relative to another capacitive plate in the transducer. As the mechanical structure moves, a change in capacitance is caused by the displacement of the capacitive plate. This change in capacitance is detected by the microelectronics and used to activate the air bag.

The Analog Devices™, MEMS transducers are manufactured from a single wafer. The mechanical structure of these transducers is created by depositing a poly-silicon layer on a silicon wafer, which is typically only a few microns thick. Because of the limited thickness of the mechanical structure, the mechanical structure suffers from performance limitations. For example, because of the minimal thickness of the mechanical structure it is difficult to restrict the movement of the mechanical structure to the desired plane. This results in the microelectronics detecting movement in the desired plane as well as movement out of the desired plane (i.e., crosstalk). Due to crosstalk, resulting from the single-wafer MEMS structure, these transducers have very limited application.

Other conventional MEMS devices typically comprise two chips wired together. In these MEMS devices, one chip includes the micro mechanical structure and the other chip includes the micro electronic structure. These two chips are manufactured separately and wired-bonded together. This results in performance degradation and increased costs. For example, stray capacitances are introduced due to the necessity of wire-bonding the two chips together. Also, these two chips must be packaged together as a single device, which increases costs.

SUMMARY OF EMBODIMENTS OF THE INVENTION

According to an embodiment, a microelectromechanical system (MEMS) device comprises a first wafer, a second wafer, and a third wafer. At least a portion of the second wafer is movably connected between the first wafer and the third wafer. A material is included that bonds the first wafer, the second wafer, and the third wafer together.

According to another embodiment, a MEMS device comprises a chip including three wafers connected together in a stacked arrangement. The stacked arrangement comprises a first wafer of the three wafers, a second wafer of the three wafers connected below the first wafer in the stacked arrangement wherein the second wafer includes a movable portion, and a third wafer of the three wafers connected below the second wafer in the stacked arrangement. The three wafers are connected using a bonding material. At least one via in the second wafer is provided that is operable to pass electrical signals through the second wafer.

According to another embodiment, a three-wafer MEMS chip comprises mechanical means for moving in response to one of an external force and a force generated internal to the chip. The mechanical means is a portion of a second wafer located between a first wafer and a second wafer. The chip further comprises bonding means for bonding the first wafer, the second wafer and the third wafer to form a single chip, and via means for conducting electrical signals through the second wafer.

According to yet another embodiment, a MEMS data storage device comprises a first wafer, a second wafer, and a third wafer, wherein at least a portion of the second wafer is movably connected between the first wafer and the third wafer. The device further comprises material bonding the first wafer, the second wafer, and the third wafer, a storage media storing data, and at least one circuit associated with performing data operations using the storage media.

According to yet another embodiment, a MEMS transducer device comprises a first wafer, a second wafer, and a third wafer, wherein at least a portion of the second wafer is movably connected between the first wafer and the third wafer. The transducer further comprises material bonding the first wafer, the second wafer, and the third wafer, and at least one circuit operable to detect movement of the at least a portion of the second wafer.

BRIEF DESCRIPTION OF THE DRAWINGS

The present invention is illustrated by way of example and not limitation in the accompanying figures in which like numeral references refer to like elements, and wherein.

DETAILED DESCRIPTION OF EMBODIMENTS

According to an embodiment, a MEMS comprises at least three-wafers. The three wafers are sealed together to form a one-chip MEMS device. According to another embodiment, a three-wafer MEMS device comprises a transducer. According to yet another embodiment, a three-wafer MEMS device comprises a storage device.

Figure 1:
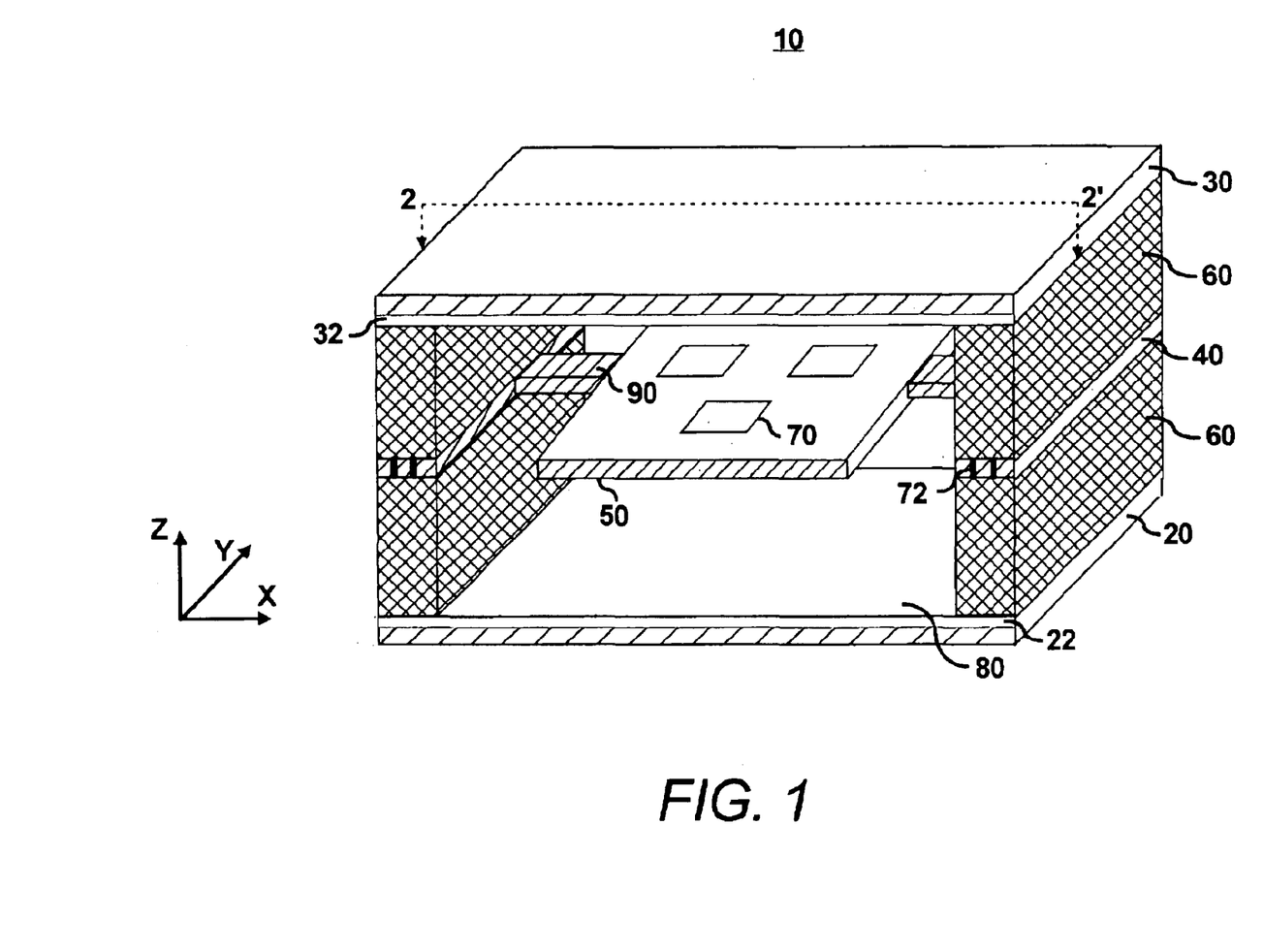
FIG. 1 illustrates a perspective view of a MEMS device, according to an embodiment.

FIG. 1 illustrates a perspective view of a MEMS device 10, according to an embodiment. The MEMS device 10 includes a middle wafer 40 positioned between an upper wafer 30 and a lower wafer 20. A material 60 bonds the wafers 20, 30 and 40 together to form a single chip. The material 60 also seals the device 10. A cavity 80 is formed between the upper wafer 30 and lower wafer 20. The cavity 80 is sealed by the material 60. The material 60 may comprise a wafer bonding material, or the like.

The middle wafer 40 includes a movable portion 50 capable of moving relative to the lower and upper wafers 20 and 30 within the cavity 80. For example, the middle wafer 40 may be trenched to form the movable portion 50. Flexures 90 connect the movable portion 50 to the remaining portion of the wafer 40. The flexures 90 allow the movable portion 50 to move in a desired direction relative to the lower wafer 20 and the upper wafer 30. For example, the flexures 90 may be designed to allow the movable portion 50 to move in any of the X, Y or Z directions or combination of any of those directions. The flexures 90 may also be formed from the middle wafer 40.

The movable portion 50 moves within the cavity 80 of the MEMS device 10. The cavity 80 is sealed by the material 60. The cavity 80, for example, may include a vacuum or may include a dielectric. Also, a hermetic seal operable to substantially prevent moisture from entering the MEMS device 10 may be created from the material 60 and/or using other materials and seals.

The MEMS device 10 is shown with the material 60 being significantly thicker than the wafers 20–40 for purposes of illustrating all the features of the MEMS device 10. It will be apparent to one of ordinary skill in the art that the thickness of the material 60 and the wafers 20–40 may have proportions other than shown in FIG. 1. In one embodiment, the thickness of the material 60 between the middle wafer 40 and the bottom wafer 20 (which is approximately equal to the gap between the wafers), for example, may be approximately 0.1 to 10 microns. Similarly, the thickness of the material 60 between the middle wafer 40 and the top wafer 10, for example, may be approximately 0.1 to 10 microns. Furthermore, the thickness of a wafer is typically 500–600 microns thick. The middle wafer 40 may have a thickness of approximately 300 microns or less for forming the vias 72. By reducing the thickness of the middle wafer 40, the manufacturing process for creating the vias 72 becomes much less difficult.

The middle wafer 40 comprises vias 72 which conduct electrical signals through the middle wafer 40. For example, electrical signals may be transmitted from a circuit 32 on the upper wafer 30 to a circuit 22 on the lower wafer 20 or vice versa through the vias 72. Also, the vias 72 may be used to transmit signals to a circuit on a surface of the middle wafer 40 from one of the other wafers 20 and 30. For example, the circuit 22 can transmit signals to the electrodes 70 on an upper surface of the middle wafer 40, and the circuit 32 may transmit signals to electrodes 52 (shown in FIG. 2) on a lower surface of the middle wafer 40. The circuits 22 and 32 and the electrodes 52 are shown to illustrate that the vias 72 may be used to transmit signals through the middle wafer 40 to a component on a surface of the movable portion 50 or to a component on the upper wafer 30 or the lower wafer 20. Furthermore, conductors (not shown), for example, running along the flexures 90, may be used to connect circuits on the movable portion 50 of the middle wafer 40 to the vias 72. It will be apparent to one of ordinary skill in the art that in various embodiments, one or more of the circuits 22 and 32 and the electrodes 70 and 52 are optionally used depending on the design of the MEMS device 10 for any particular application. Furthermore, a circuit, as described herein, comprises passive components (e.g., capacitors, inductors, resistors, electrodes, etc.) or active components (e.g., transistors, etc.), or a combination thereof. Electrodes 70 and 52 are shown as being provided on surfaces of the middle wafer 40, however, a circuit including active and/or passive components may be provided on any of these surfaces. In addition, a circuit may include components on more than one wafer. For example, components of the circuit 22 may also be provided on the upper wafer 30, and these components may communicate through the vias 72.

Figure 2:
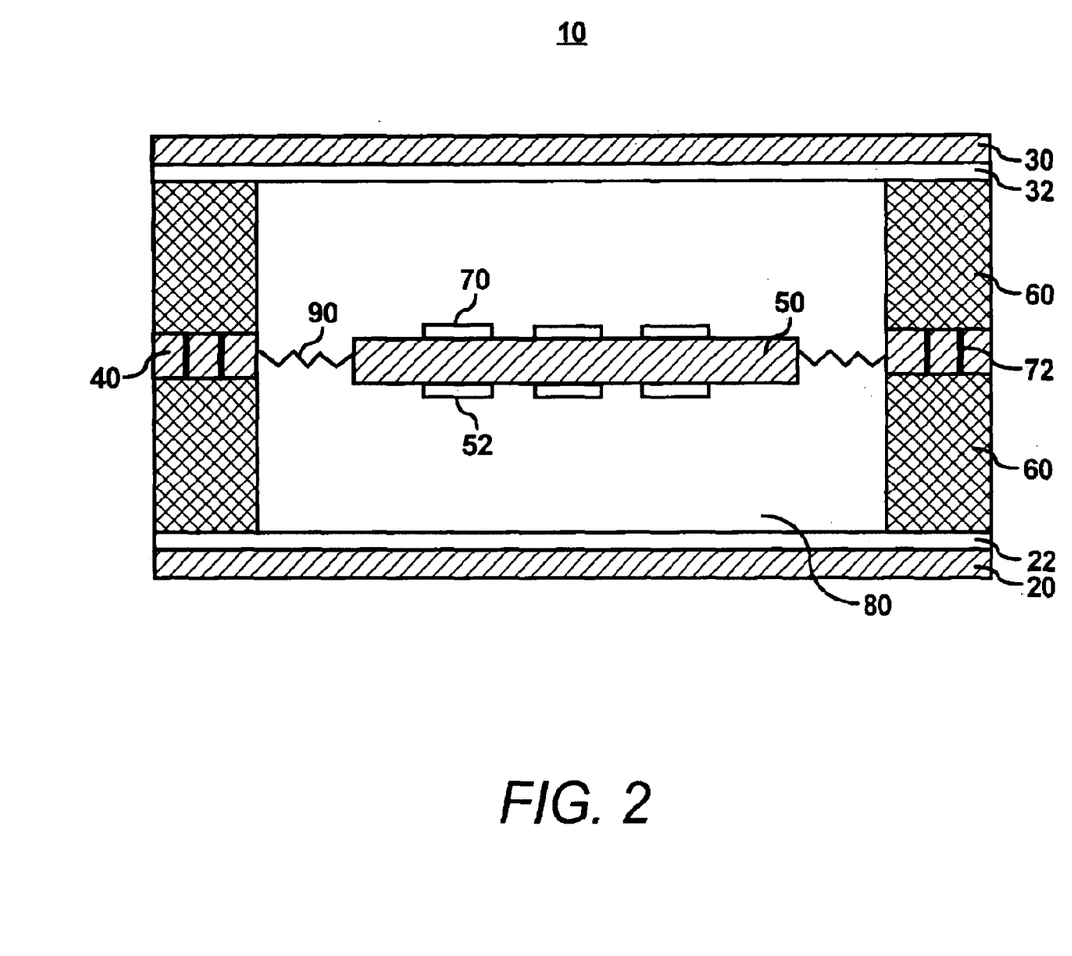
FIG. 2 illustrates a cross-section of the MEMS device of FIG. 1.

FIG. 2 illustrates a cross-section of the MEMS device 10, shown in FIG. 1, taken across the line 2–2'. The vias 72 and other components of the MEMS device 10 are illustrated in FIG. 2. In one embodiment, the vias 72 may each include the wafer substrate (e.g., silicon or a polysilicon) surrounded by an insulator. The wafer substrate may be conductive, so it may be used as a conductor for the vias 72 to pass signals through the wafer 40. An insulator is used for each of the vias 72 to create more than one via in the wafer 40 by isolating the conductors forming the vias 72. In another embodiment, an insulator may be filled with metal to form a via in the wafer 40.

Figure 3:
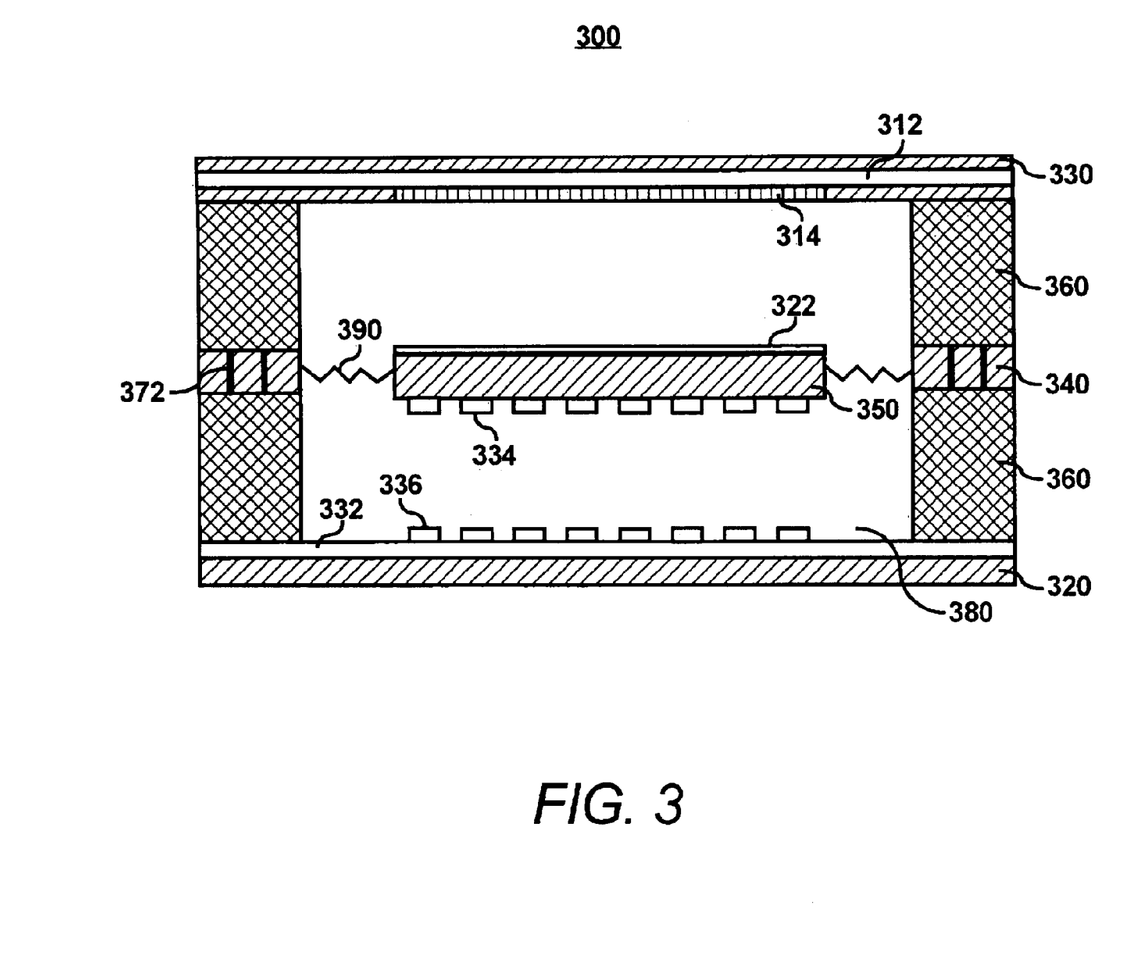
FIG. 3 illustrates a cross-section of a MEMS data storage device, according to an embodiment.

FIG. 3 illustrates a cross-section of a MEMS data storage device 300, according to an embodiment of the invention, which incorporates many of the features of the MEMS device 10 shown in FIGS. 1 and 2. The MEMS data storage device 300 includes three bonded wafers, i.e., a tip wafer 330, also referred to as an upper wafer, a rotor wafer 340, also referred to as the middle wafer, and a stator wafer 320, also referred to as the lower wafer. The wafers 320–340 are bonded and sealed, for example, using the bonding material 360. The rotor wafer 340, e.g., approximately 100 microns thick, may be much thinner than the tip wafer 330 and the stator wafer 320, e.g., approximately 500–600 microns thick for forming the vias 392.

The wafer-to-wafer bonds form an internal cavity 380 sealed at high vacuum. The bonding material 360 seals the cavity 380 to maintain the vacuum in the cavity 380. The bonding material 360 may comprise ultra-high vacuum (UHV) seals and/or other known materials for maintaining the internal environment of the MEMS data storage device 300.

The MEMS storage 300 further comprises tip emitter electronics 312, field emitter tips 314, storage media 322, and read/write (R/W) electronics 332. The tip emitter electronics 312 may comprise one or more circuits formed on the tip wafer 330. The tip emitter electronics 312 are connected to the field emitter tips 314. The field emitter tips 314, under the control of the tip emitter electronics 312, are operable to emit electron beams by drawing electrons off a metal in the field emitter tips 314 with a high electromagnetic field. Each beam may be focused on a specific location of the storage media 322 located on an upper surface of the rotor wafer 340, across from the field emitter tips 314. The beams are focused and used to write data bits onto the storage media 322 by heating tiny data spots and altering the data spots physical state or phase. A beam may also be used to determine a data bit state (value) in the storage media 322. The storage media 322 may include medium recording cells (not shown) for storing bits of data in the MEMS data storage device 300. U.S. Pat. No. 6,440,820, entitled, "Process Flow for ARS Mover Using Selenidation Wafer Bonding After Processing a Media Side of a Rotor Wafer" by Lee et al. and U.S. Pat. No. 5,557,596, entitled, "Ultra-High Density Storage Device" by Gibson et al. disclose storage devices with emitters, and are hereby incorporated by reference in their entireties.

Instead of the field emitter tips 314, other R/W mechanisms may be used. In one embodiment, optical emitters (e.g., laser emitters, LEDs, etc.) are used. The optical emitters, which also may be represented by 314 (but used instead of the field emitter tips), emit optical beams (i.e., photons). Similarly to the electron beams of the field emitter tips, the optical beams emitted by the laser emitters may be focused and used to write data bits onto the storage media 322 by heating tiny data spots and altering the data spots physical state or phase. A beam may also be used to determine a data bit state (value) in the storage media 322. In yet another embodiment of a R/W mechanism, micro-cantilevers, which also may be represented by 314, are used instead of the field emitter tips. The micro-cantilevers may include heated cantilevers or piezoelectric cantilevers for interacting with the storage media 322 to read or write data from the storage media 322. For each embodiment, the tip emitter electronics 312 may be substituted with other electronics that can be used to control the respective implementation of the R/W mechanism.

R/W electronics 332 comprises one or more circuits, which control reading or writing of data bits in the storage media 322, and to access data bits in the storage media 322 to determine data bit value. The R/W electronics 332 control with nanometer precision the movement of a movable portion 350 of the rotor wafer 340. The movable portion 350 includes the storage media 322. The movable portion 350 is moved such that the field emitter tips 314 can focus beams on the storage media 322 to access a specific set of bits. Electrodes 334 are provided on a lower surface of the movable portion 350 and electrodes 336 are provided on an upper surface of the stator wafer 320, across from the electrodes 334.

The electrodes 334 and 336 are coupled to move the movable portion 350 under control of the R/W electronics 332. The electrodes 334 and 336 comprise multiple individual electrodes. The individual electrodes may be grouped together to form repeating patterns of electrodes covering much of the surface of the moveable portion 350. The R/W electronics 332 energizes the electrodes 334 and 336 to one of two voltage states in a pattern. The individual electrodes repeat this pattern across the moveable portion 350. The position of the moveable portion 350 can be changed by changing the voltage pattern on electrodes 334 and 336 in a particular order.

Also, the storage media 322 is connected through electrodes (not shown) to the vias 372 so bit values may be transmitted to the R/W electronics 332. Also, the R/W electronics 332 are connected through the vias 372 to the tip emitter electronics 312, such that the R/W electronics 332 may transmit signals to the tip emitter electronics 312 to control reading, writing and accessing bits on the storage media 322.

Flexures 390, shown in FIG. 3, hold the movable portion 350 of the rotor wafer 340 between the field emitter tips 314 and the stator wafer 320 to allow the data bits in the storage media 322 to be moved relative to the field emitter tips 314, thus allowing each field emitter tip 314 to access multiple data bits after each movement of the storage media 322.

The R/W electronics 332 are shown in FIG. 3 as provided on the stator wafer 320. However, one or more circuits of the R/W electronics 332 may be provided on the rotor emitter wafer 330 or the rotor wafer 320. Similarly, one or more circuits of the tip emitter electronics 312 may be provided on the stator wafer 320 or the rotor wafer 340. By using the vias 372, circuits may be in electrical communication even if distributed on multiple wafers in the MEMS data storage device 300. Furthermore, the MEMS data storage device 300 is provided as a single chip, which is generally cheaper than packaging a storage device comprised of multiple chips. In addition, because a three-wafer structure is used, rather than a single wafer structure, machining of the wafers may be performed (e.g., thinning the rotor wafer 340 to approximately 100 microns) without significantly impacting the integrity of the wafers. The advantages of the three-wafer structure are also applicable to the MEMS device 10 shown in FIGS. 1 and 2, and the MEMS transducer device 400 shown in FIG. 4.

Figure 4A:
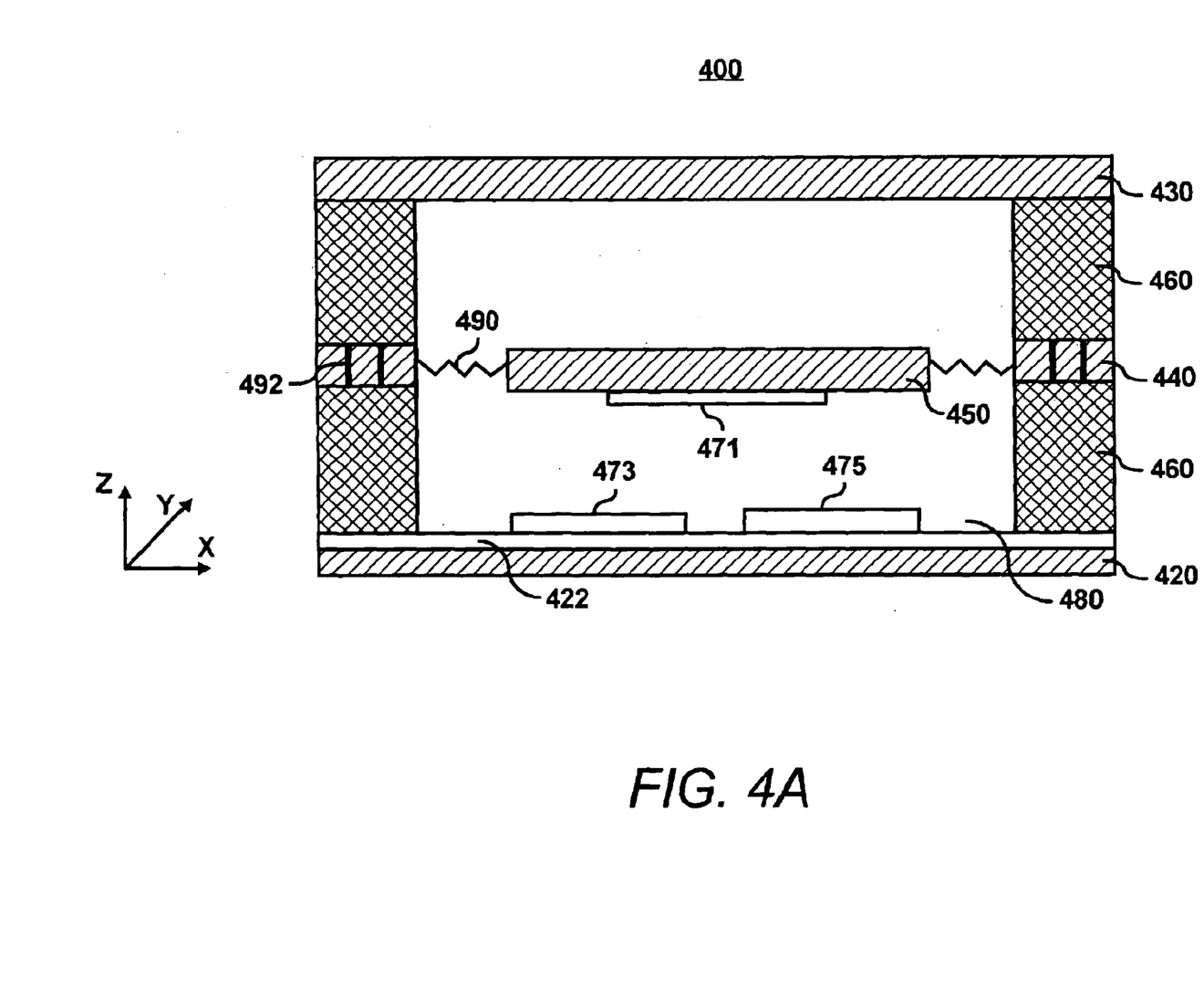
FIGS. 4A–4B illustrate cross-sections of a MEMS transducer device, according to an embodiment.
Figure 4B:
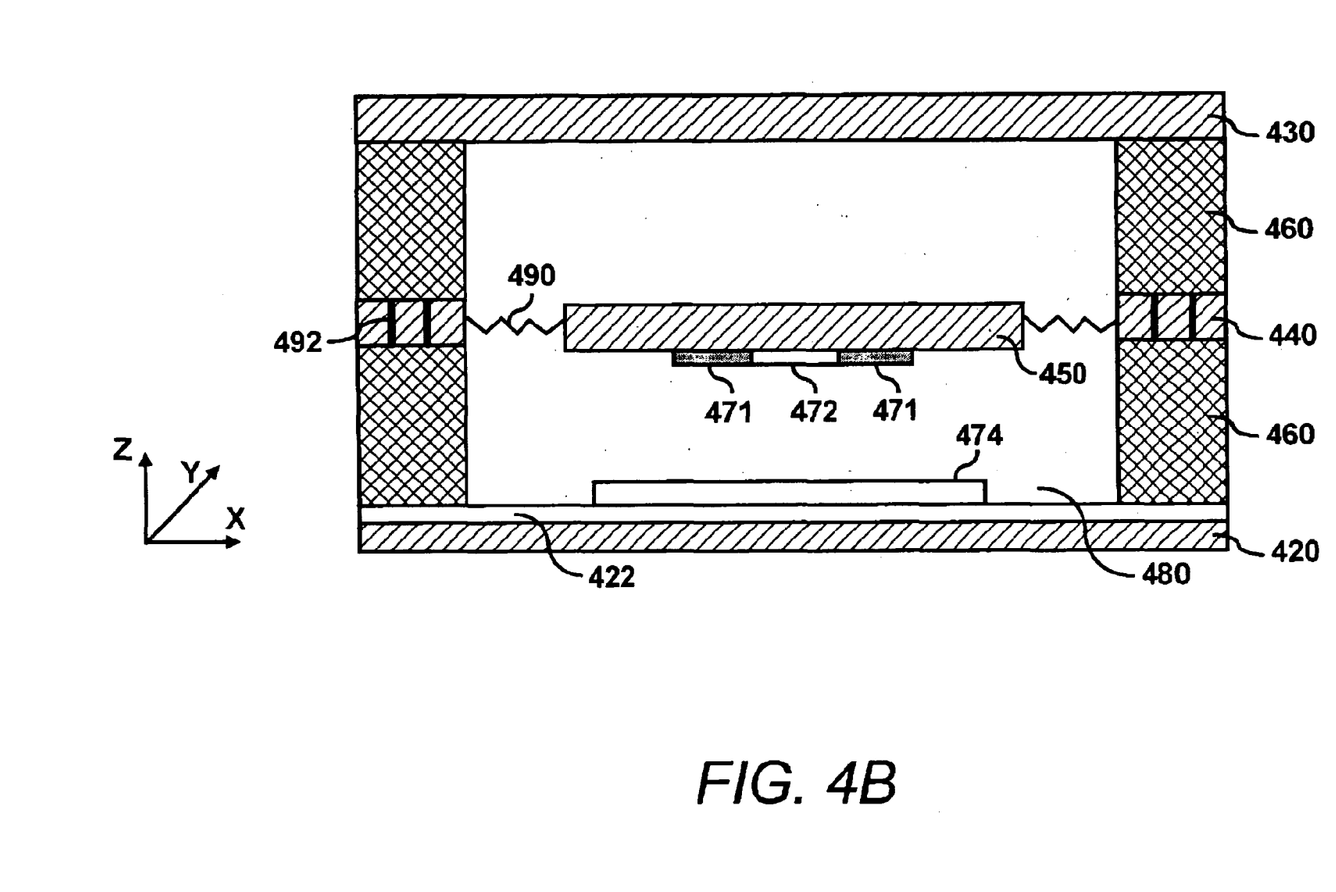

FIGS. 4A–B illustrate a cross-section of a MEMS transducer device 400, according to an embodiment of the invention, which incorporates many of the features of the MEMS device 10 shown in FIGS. 1 and 2. Referring to FIG. 4A, the MEMS transducer device 400 detects movement of the MEMS transducer device 400 using capacitor plates, or electrodes, to detect movement of a moveable portion 450 of a middle wafer 440. Flexures 490 allow the moveable portion 450 to move in one or more of the x, y, or z directions in response to an external force, depending on the design of the system.

The middle wafer 450 is positioned between an upper wafer 430 and a lower wafer 420 and connected to each with a material 460. The material 460 functions as a seal to seal a dielectric in a cavity 480. The seal may also be hermetic to keep moisture out of the cavity 480. The material 460 may include wafer bonding material as is known in the art. The wafers 420–440 are bonded and sealed to form a single chip.

The MEMS transducer device 400 includes an electrode 471 on a lower surface of the movable portion 450 of the middle wafer 440. Electrodes 473 and 475 are located opposite electrodes on an upper surface of the lower wafer 420. As the movable portion 450 moves, the overlap between the electrode 471 and the electrodes 475 and 473 varies causing a change in capacitance between the electrodes 471 and 473,475. Movement of the MEMS transducer device 400 in the x and/or y direction is detected by detecting the change in capacitance.

Equation 1 may be used to calculate a change in capacitance between electrodes, where $\epsilon$ is the dielectric constant.

$$C=(\epsilon *A)/d \qquad \text{Equation (1)}$$

A is the overlap between electrodes in the x and y direction and d is the distance between electrodes in the z direction. This equation is also described in U.S. Pat. No. 6,504,385, entitled, "Three-Axis Motion Detector" by Hartwell et al, which is hereby incorporated by reference in its entirety.

Movement in the z direction may also be determined using another set of electrodes shown in FIG. 4B. FIG. 4B is rear view of the MEMS transducer device 400 taken at the same cross-section shown in FIG. 4A. Electrode 472, located on the movable portion 450, and electrode 474, located on the lower wafer 420, are provided for determining movement in the z-direction. The electrode 472 may have a short length and the electrode 474 may extend the length of the moveable portion 450 such that the overlap between the electrodes 472 and 474 does not change. Therefore, any change in capacitance detected between the electrodes 472 and 474 is substantially the result of movement in the z-direction. The electrodes 473 and 475 shown in FIG. 4A are also on the lower wafer 420. However, the electrodes 473 and 475 are hidden from view by the electrode 474 shown in FIG. 4B. The electrode 471, shown in FIG. 4A on the movable portion 450, is only partially hidden by the electrode 472 in the rear view shown in FIG. 4B. The partially hidden electrode 471 in FIG. 4B is shown as shaded. In FIG. 4A, a portion of the electrode 474 would be visible between the electrodes 473 and 475. However, this portion of the electrode 474 is not shown in FIG. 4A to clearly illustrate the electrodes 473 and 475. Also, the electrode 472 is hidden behind the electrode 471 in the view shown in FIG. 4A.

The three-wafer structure allows the moveable portion 450 to move a significantly greater distance in the x, y, or z directions than conventional single-wafer capacitive MEMS transducers. Furthermore, the greater distances may allow the MEMS transducer device 400 to be used for different applications and to achieve greater accuracy in known applications.

Transducer electronics 422 shown in FIGS. 4A–B includes one or more circuits detecting the change in capacitance between the electrodes 471 and 473,475 and between the electrodes 472 and 474. The electrodes 471 and 472 on the moveable portion 450 are connected to the transducer electronics 422 using the vias 492. For example, conductors, not shown, connect the electrodes 471 and 472 to the vias 492. The signal from the electrodes is passed through the vias 492 to the transducer electronics 422. The transducer electronics 422 is also connected to the electrodes 473–475 on the lower wafer 420. Thus, the transducer electronics 422 is operable to detect the change in capacitance between the electrodes. The transducer electronics may comprise one or more circuits for calculating the change in overlap A and/or distance d between the electrodes. Alternatively, the transducer electronics 422 may output the change in capacitance to an external circuit for calculating the change in overlap A and/or distance d. Using equation 1, the distance d may be calculated from the change in capacitance between the electrodes 472 and 474. Also, if d is known, the overlap A may also be calculated from the change in capacitance detected between the electrodes 471 and 473,475 shown in FIG. 4A.

Figure 5:
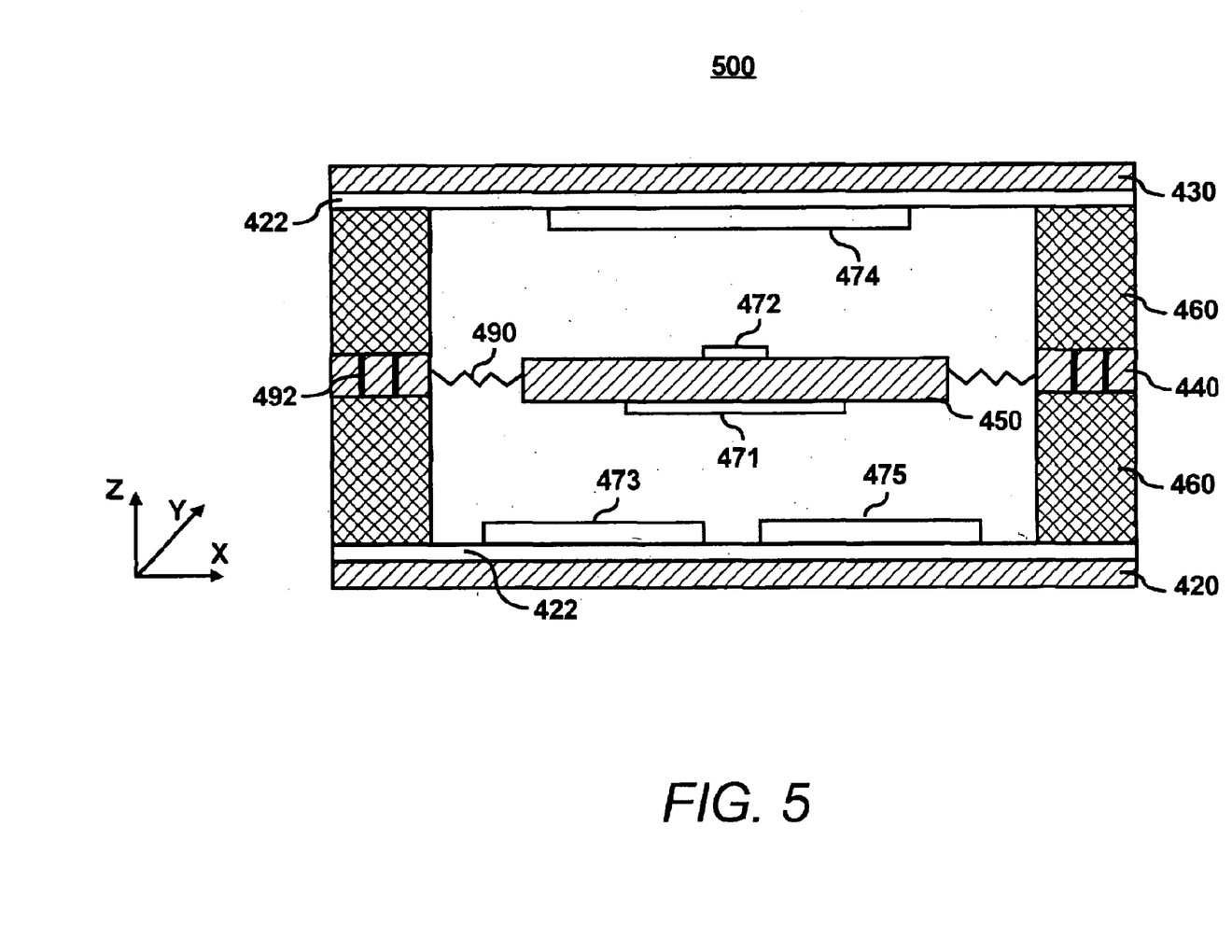
FIG. 5 illustrates a cross-section of a MEMS transducer device, according to another embodiment.

In this embodiment, the upper wafer 430 may comprise a cap wafer that protects the MEMS transducer device 400. In other embodiments, such as shown in FIG. 5, one or more electrodes may be placed on the upper wafer 430. Also, one or more circuits for the transducer electronics can be provided on the upper wafer 430.

FIG. 5 illustrates a cross-section of another embodiment of a MEMS transducer device. A MEMS transducer device 500 is shown that is similar to the MEMS transducer device 400 of FIGS. 4A–B. In this embodiment, the electrode 472 is located on the upper surface of the moveable portion 450 and opposite the electrode 474 located on the upper wafer 430. Transducer electronics 422 are provided in both the upper wafer 430 and the lower wafer 420 for detecting change in capacitance.

It will be apparent to one of ordinary skill in the art that more electrodes may be used or the size and shape of the electrodes may be varied for detecting change in capacitance in one or more of the x, y, and z directions. For example, in U.S. Pat. No. 6,504,385 five electrodes and five counter electrodes are used to detect movement in the x, y, and z directions. Also, a less number of electrodes may be used if movement in one or two directions is to be detected.

What has been described and illustrated herein are embodiments of the invention along with some of variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A microelectromechanical system (MEMS) device comprising:

a first wafer;

a second wafer; and a third wafer, wherein at least a portion of the second wafer is movably connected between the first wafer and the third wafer;

material bonding the first wafer, the second wafer, and the third wafer together;

an internal cavity formed between the first wafer and third wafer, wherein the at least a portion of the second wafer is located within the internal cavity; and a seal formed from the material bonding the first wafer, the second wafer, and the third wafer together, wherein the seal seals the internal cavity.

2. The MEMS device of claim 1, further comprising:

a vacuum in the internal cavity, wherein the seal seals the vacuum in the internal cavity.

3. The MEMS device of claim 1, further comprising:

a dielectric in the internal cavity, wherein the seal seals the dielectric in the internal cavity.

4. The MEMS device of claim 1, wherein the seal comprises a hermetic seal operable to substantially prevent moisture from entering the internal cavity.

5. The MEMS device of claim 1, further comprising:

a chip including the first wafer, the second wafer, and the third wafer bonded together.

6. The MEMS device of claim 5, wherein the first wafer is a cap protecting the second wafer and the third wafer in the chip.

7. The MEMS device of claim 1, further comprising:

at least one via in the second wafer, the at least one via providing a path for electrical signals traveling through the second wafer.

8. The MEMS device of claim 7, wherein the at least one via comprises a conductor extending through the second wafer.

9. The MEMS device of claim 7, wherein a thickness of the second wafer is approximately equal to 300 microns or less.

10. The MEMS device of claim 7, further comprising:

a first circuit; and a second circuit, wherein the first circuit and the second circuit are in electrical communication with each other by transmitting the electrical signals using the at least one via.

11. The MEMS device of claim 10, wherein the first circuit is on the first wafer and the second circuit is on the third wafer.

12. The MEMS device of claim 10, wherein the first circuit comprises active or passive components on one of an upper surface and a lower surface of the second wafer, and the second circuit is on one of the first wafer and the third wafer.

13. The MEMS device of claim 7, further comprising:

a first circuit including components on at least one of the first wafer and the third wafer and also including components on the second wafer;

wherein at least one of the components on the first wafer or the third wafer and at least one of the components on the second wafer are in electrical communication with each other by transmitting the electrical signals using the at least one via.

14. The MEMS device of claim 13, wherein the first circuit comprises mover electronics operable to control a movement of the at least a portion of the second wafer in a MEMS storage device.

15. The MEMS device of claim 14, further comprising:

a read/write mechanism on the first wafer;

a read/write mechanism electronics on at least the first wafer; and a storage media on the second wafer opposite the read/write mechanism; wherein the read/write mechanism electronics is operable to control the read/write mechanism to read, write or access bits from the storage media.

16. The MEMS device of claim 15, wherein the read/write mechanism comprises at least one of field emitter tips, optical emitters, and micro-cantilevers.

17. The MEMS device of claim 15, wherein:
the read/write mechanism electronics comprises emitter electronics at least on the first wafer;
the read/write mechanism comprises emitter tips on the first wafer; and the emitter electronics is operable to control the emitter tips to read, write or access bits from the storage media.

18. The MEMS device of claim 15, wherein the mover electronics includes components on the third wafer that communicate through the at least one via to the read/write mechanism electronics to invoke reading, writing, or accessing bits from the storage media.

19. The MEMS device of claim 13, wherein the first circuit comprises transducer electronics and electrodes comprising capacitive plates, wherein at least one of the electrodes is on the at least a portion of the second wafer; the transducer electronics being operable to detect movement of the at least a portion of the second wafer by detecting a change in capacitance between the capacitive plates.

20. The MEMS device of claim 19, wherein the transducer electronics is operable to detect movement in one or more of the x, y, and z directions.

21. A MEMS device comprising:
a chip including three wafers connected together in a stacked arrangement; the stacked arrangement comprising:
a first wafer of the three wafers;
a second wafer of the three wafers connected below the first wafer in the stacked arrangement, the second wafer including a movable portion; and
a third wafer of the three wafers connected below the second wafer in the stacked arrangement, wherein the three wafers are connected using a bonding material; and
at least one via in the second wafer operable to pass electrical signals through the second wafer.

22. The MEMS device of claim 21, further comprising at least one circuit including components on at least two of the three wafers, wherein the components are in electrical communication by passing signals through the at least one via.

23. The MEMS device of claim 22, further comprising a capacitive transducer operable to detect movement of the moveable portion of the second wafer.

24. The MEMS device of claim 23, further comprising:
a dielectric in an internal cavity formed between the first and third wafers; and
the at least one circuit comprises opposing electrodes forming a capacitor.

25. The MEMS device of claim 22, further comprising a MEMS storage device operable to store bits in a storage media on one of the three wafers.

26. The MEMS device of claim 25, wherein the at least one circuit comprises:
mover electronics operable to invoke read/write mechanism electronics to control a read/write mechanism to read, write or access bits from the storage media.

27. The MEMS device of claim 26, wherein the read/write mechanism comprises at least one of field tip emitters, optical emitters, and micro-cantilevers.

28. The MEMS device of claim 26, wherein the mover electronics are operable to move the movable portion of the second wafer to read, write, or access bits from a different locations on the storage media.

29. A three-wafer MEMS chip comprising:
mechanical means for moving in response to one of an external force and a force generated internal to the chip, the mechanical means being a portion of a second wafer located between a first wafer and a third wafer;
bonding means for bonding the first wafer, the second wafer and the third wafer to form a single chip; and
via means for conducting electrical signals through the second wafer.

30. The three-wafer MEMS chip of claim 29, further comprising:
an internal cavity means formed between the first wafer and third wafer, the internal cavity means for enclosing one or more of a dielectric and a vacuum.

31. The three-wafer MEMS chip of claim 30, wherein the bonding means further comprises means for sealing the internal cavity wafer.

32. The three-wafer MEMS chip of claim 29, further comprising:
a first circuit means including components on at least one of the first wafer and the third wafer and also including components on the second wafer;
wherein at least one of the components on the first wafer or the third wafer and at least one of the components on the second wafer are in electrical communication with each other by transmitting the electrical signals using the via means.

33. The three-wafer MEMS chip of claim 32, wherein the first circuit means comprises means for at least one of (1) invoking movement of the mechanical means, (2) reading or writing data to a storage means, and (3) detecting movement of the mechanical means.

34. A MEMS data storage device comprising:
a first wafer;
a second wafer;
a third wafer, wherein at least a portion of the second wafer is movably connected between the first wafer and the third wafer;
material bonding the first wafer, the second wafer, and the third wafer;
a storage media storing data; and
at least one circuit associated with performing data operations using the storage media.

35. The MEMS data storage device of claim 34, wherein the bonding material bonds the first wafer, the second wafer, and the third wafer forming a single chip MEMS data storage device.

36. The MEMS data storage device of claim 34, further comprising:
at least one via in the second wafer, the at least one via providing a path for electrical signals traveling through the second wafer.

37. The MEMS data storage device of claim 36, wherein the at least one circuit comprises:
components on at least one of the first wafer and the third wafer and also including components on the second wafer;
wherein at least one of the components on the first wafer or the third wafer and at least one of the components on the second wafer are in electrical communication with each other by transmitting the electrical signals using the at least one via.

38. The MEMS data storage device of claim 37, wherein the at least one circuit comprises mover electronics operable to control a movement of the at least a portion of the second wafer in the MEMS data storage device.

39. The MEMS data storage device of claim 38, further comprising:
a read/write mechanism on the first wafer;
a read/write mechanism electronics included in the at least one circuit, the read/write mechanism electronics located on at least the first wafer; and
the storage media located on the second wafer opposite the read/write mechanism; wherein
the read/write mechanism electronics is operable to control the read/write mechanism to read, write or access bits from the storage media.

40. The MEMS data storage device of claim 39, wherein the read/write mechanism comprises at least one of field emitter tips, optical emitters, and micro-cantilevers.

41. The MEMS data storage device of claim 39, wherein:
the read/write mechanism electronics comprises emitter electronics at least on the first wafer; and
the read/write mechanism comprises emitter tips on the first wafer; and the emitter electronics is operable to control the emitter tips to read, write or access bits from the storage media.

42. The MEMS data storage device of claim 38, wherein the mover electronics includes components on the third wafer that communicate through the at least one via to the read/write mechanism electronics to invoke reading, writing, or accessing bits from the storage media.

43. The MEMS data storage device of claim 34, further comprising:
an internal cavity formed between the first wafer and third wafer, wherein the at least a portion of the second wafer is located within the internal cavity.

44. The MEMS data storage device of claim 43, further comprising a vacuum enclosed in the internal cavity by the material.

45. A MEMS transducer device comprising:
a first wafer;
a second wafer;
a third wafer, wherein at least a portion of the second wafer is movably connected between the first wafer and the third wafer;
material bonding the first wafer, the second wafer, and the third wafer; and
at least one circuit operable to detect movement of the at least a portion of the second wafer, wherein the at least one circuit is located on one or more of the first wafer, the second wafer, and the third wafer.

46. The MEMS transducer of claim 45, wherein the at least one circuit is operable to detect movement in one or more of x, y, and z directions.

47. The MEMS transducer of claim 46, wherein the movement is in response to an external force.

48. The MEMS transducer of claim 45, wherein the bonding material bonds the first wafer, the second wafer, and the third wafer forming a single chip MEMS transducer device.

49. The MEMS transducer of claim 45, further comprising:
at least one via in the second wafer, the at least one via providing a path for electrical signals traveling through the second wafer.

50. The MEMS transducer of claim 49, wherein the at least one circuit comprises:
components on at least one of the first wafer and the third wafer and also including components on the second wafer;
wherein at least one of the components on the first wafer or the third wafer and at least one of the components on the second wafer are in electrical communication with each other by transmitting the electrical signals using the at least one via.

51. The MEMS transducer of claim 50, wherein some of the components of one or more of the first, second and third wafers comprise electrodes forming capacitive plates on at least two of the first wafer, the second wafer, and the third wafer, the at least one circuit detecting a change in capacitance between the capacitive plates to detect movement of the at least a portion of the second wafer.

52. The MEMS transducer of claim 50, further comprising:
a dielectric sealed between the capacitive plates by the material.

53. The MEMS transducer of claim 51, wherein the first wafer is a protective cap.

* * * * *